United States Patent [19]
Bilotti et al.

[11] Patent Number: 5,621,319
[45] Date of Patent: Apr. 15, 1997

[54] CHOPPED HALL SENSOR WITH SYNCHRONOUSLY CHOPPED SAMPLE-AND-HOLD CIRCUIT

[75] Inventors: Alberto Bilotti, Florida; Gerardo Monreal, Capital, both of Argentina

[73] Assignee: Allegro Microsystems, Inc., Worcester, Mass.

[21] Appl. No.: 569,814

[22] Filed: Dec. 8, 1995

[51] Int. Cl.$^6$ .................. G01R 33/07; H03K 5/1254
[52] U.S. Cl. .................. 324/251; 324/225; 327/384; 327/511; 327/551
[58] Field of Search ............... 324/207.12, 207.2, 324/225, 251, 117 H; 327/291, 310, 384–386, 510, 511, 551; 73/DIG. 3; 326/26

[56] References Cited

U.S. PATENT DOCUMENTS

| | | | |
|---|---|---|---|
| 4,037,150 | 7/1977 | Taranov et al. | 324/251 |
| 5,241,270 | 8/1993 | Ng | 324/251 |
| 5,406,202 | 4/1995 | Mehrgardt et al. | 324/251 |
| 5,493,218 | 2/1996 | Hayashi et al. | 324/252 X |
| 5,517,112 | 5/1996 | Vig et al. | 324/251 |

FOREIGN PATENT DOCUMENTS

WO93/1541  8/1993  WIPO .

OTHER PUBLICATIONS

Sensor Signal Conditioning: An IC Designer's Perspective, *Sensors*, Nov. 1991, pp. 23–30.

*Primary Examiner*—Gerard R. Strecker

[57] ABSTRACT

A chopped Hall sensor includes a Hall-element switching circuit of the kind in which a Hall element has two pairs of diagonally opposite Hall contacts which are alternately connected to a pair of DC supply conductors and to a pair of Hall-stitching-circuit output conductors for alternately, during phase $\phi 1$ and $n\phi 1$ of a first clock signal, switching the Hall exciting current from flow in one to another direction through the Hall element. A linear analog double-differential Hall-voltage amplifier has an input connected to the output of the Hall switching-circuit. A sample-and-hold circuit is comprised of first and second elemental sample-and-hold circuits (ESHCs) with inputs connected respectively to the two Hall-voltage differential-amplifier outputs. The first and second ESHCs are respectively clocked, by second and third clock signals, to the sample Hall voltage signal only during phases $\phi 2$ and $\phi 3$ and to hold the sample signal during phases $n\phi 2$ and $n\phi 3$ respectively, where $\phi 2$ and $\phi 3$ occur respectively during a mid portion of phases $\phi 1$ and $n\phi 1$. Two inputs of a summer circuit are connected respectively to the outputs of the first and second ESHCs. A third and fourth ESHC may be added to form a crossed-polarity full-differential sample-and-hold circuit. The Hall voltage amplifier may include a clocked noise blanking circuit for reducing the differential-gain of the amplifier only during a time span encompassing each phase transition in the first clock signal.

3 Claims, 5 Drawing Sheets

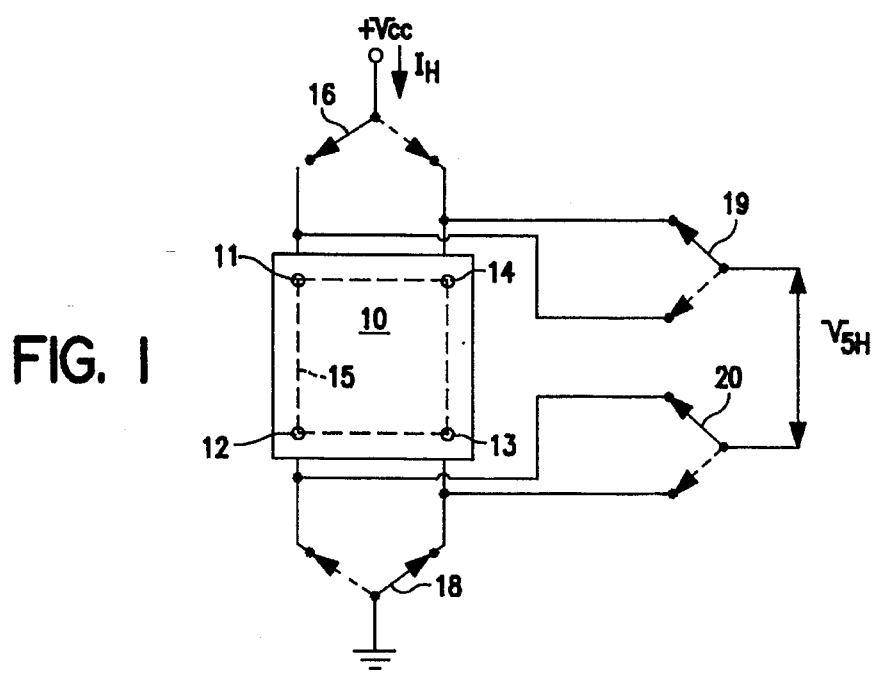
FIG. 1
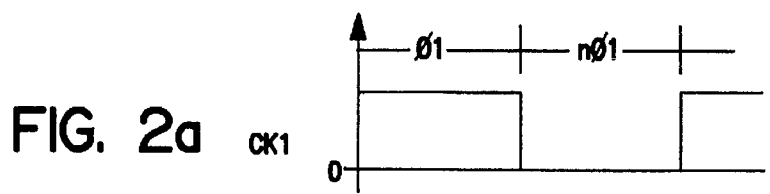
FIG. 2a  CK1
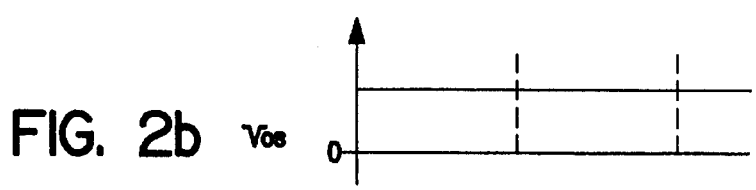
FIG. 2b  $V_{os}$
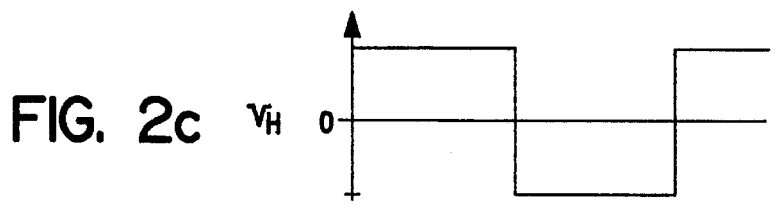
FIG. 2c  $V_H$
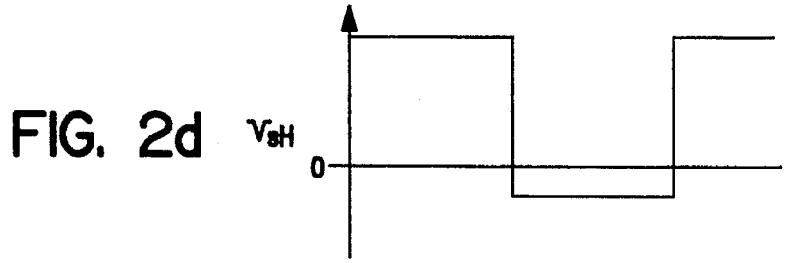
FIG. 2d  $V_{SH}$

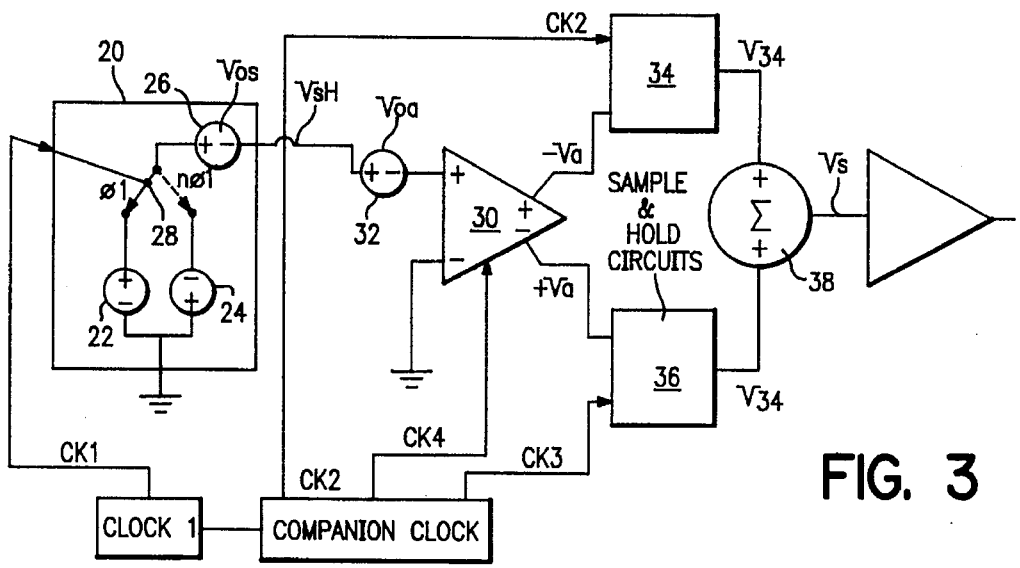
FIG. 3
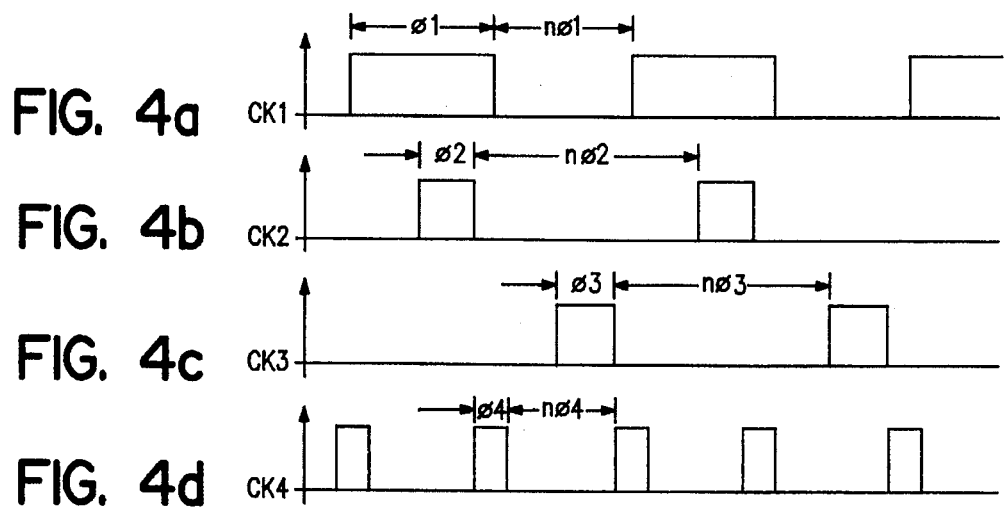
FIG. 4a
FIG. 4b
FIG. 4c
FIG. 4d
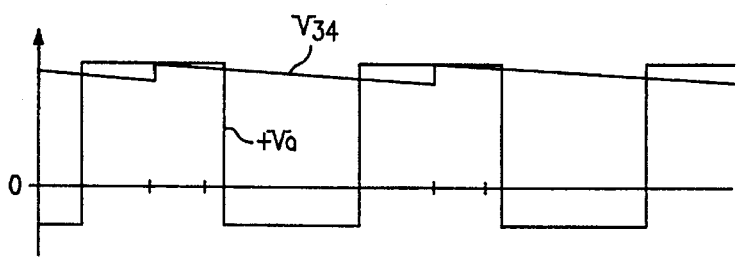
FIG. 5a
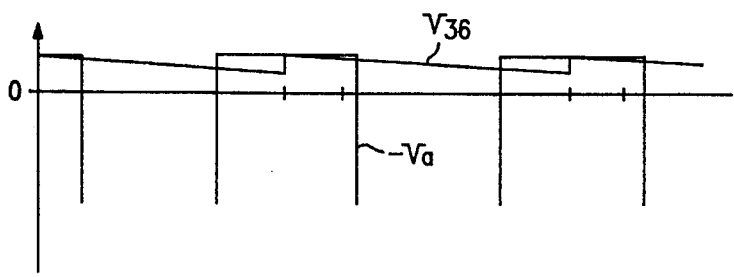
FIG. 5b

CHOPPED HALL SENSOR WITH SYNCHRONOUSLY CHOPPED SAMPLE-AND-HOLD CIRCUIT

BACKGROUND

This invention relates to a chopped Hall sensor circuit wherein the Hall-element exciting current is alternately switched from flow in one direction to flow in another direction, and more particularly relates to such a Hall sensor in which a chopped sample-and-hold Hall-voltage circuit is clocked synchronously with the switched Hall element.

It has long been common practice to excite a Hall element by connecting it permanently by two contacts to the DC supply voltage or other source of Hall current $I_H$ for obtaining a Hall voltage ($V_H$) at two other contacts that is proportional to the product of the ambient magnetic field strength (B) and the Hall exciting current $I_h$. When an ambient magnetic field is absent (zero strength), an unwanted off-set voltage (Vos) is typically produced at the Hall output contacts, and when the strength of an ambient field, B, is not zero, the Hall-element output voltage is the sum of $V_H$ and Vos. The magnitude and polarity of the unwanted off-set voltage are a function inter alia of stresses in the semiconductor chip of which it is formed, which stresses vary with mechanical pressure and temperature.

It is known to provide a switching circuit in which a Hall-element exciting current is alternately switched from flow in one direction to flow in another direction through the Hall element. Such a switching circuit is shown in FIG. 1. The symmetrical Hall element 10 has four equally spaced contacts 11, 12, 13 and 14 that define the corners of a hypothetical square 15. The contacts 11 and 14 are connected to the DC supply voltage, Vcc, via an electrically controllable single pole double throw switch 16 and the contacts 12 and 13 are connected to the supply voltage ground via an electrically controllable single pole double throw switch 18.

When the switches 16 and 18 are clocked by a high binary signal level during clock ck1 phase φ1, the Hall-element exciting current $I_H$ flows from contact 11 to contact 13. When subsequently the switches 16 and 18 are clocked by a binary signal low level during the next clock ck1 phase nφ1, the Hall-element exciting current $I_H$ flows from contact 14 to contact 12 in a direction through the Hall element that is at right angles to that which flowed during a phase φ1 of the clock signal ck1.

Switches 16, 18, 19 and 20 are shown (heavy arrow) in the positions corresponding to clock phase φ1. The other switch positions ((dashed arrows) correspond to clock phase nφ1. The periodic switching of direction of the Hall-element exciting current $I_H$, as in the circuit of FIG. 1, combined with further signal processing makes it possible to greatly reduce the amount of the offset voltage Vos. The switching circuit output voltage $V_{sH}$ is composed of Vos and the wanted Hall voltage $V_H$.

The clock signal ck1 alternately changes from phase φ1 to nφ1 as seen in FIG. 2a. In the switching circuit output voltage $V_{sH}$, the Hall voltage component $V_H$ is positive during phase φ1 and negative during phase nφ1. During each phase, the magnitude of $V_H$ is $I_H$xB. In the switching circuit output voltage $V_{sH}$, this wanted component $V_H$ (FIG. 2c) appears combined with the unwanted off-set component Vos. The polarity of the unwanted off-set voltage component Vos in $V_{sH}$ is positive and essentially of the same magnitude during both phases φ1 and nφ1, as seen in FIG. 2b. The resulting switching circuit output voltage $V_{sH}$ is the sum of the two signals Vos and $V_H$ as shown in FIG. 2d.

During phase φ1, $V_{sH}=V_H+$Vos.

During phase nφ1, $V_{sH}=-V_H+$Vos.

Thus any circuit that will subtract the two voltage levels in the signal $V_{sH}$, namely the level during phase nφ1 from that in phase φ1, will provide a difference voltage that is equal to just $2V_H$ and the Hall off-set voltage has been theoretically eliminated.

A major problem in using a Hall switching circuit such as that of FIG. 1 is that the voltage spikes generated by the switching of the Hall exciting current $I_H$ tend to be very large compared to the Hall voltage $V_H$ so that expensive filter capacitors are required. The use of large low pass filter capacitors entails substantial expense and renders such circuits useless for measuring or detecting small level fast changing magnetic fields.

It has been suggested to solve this problem by use of a switching charge-transfer amplifier to amplify the Hall voltage and reduce the switching Hall spikes. However, charge-transfer circuits themselves introduce charge injection switching noise at the lowest Hall signal level in the system.

It is an object of this invention to provide a sensitive Hall sensor followed by an amplifier and a synchronously chopped sample-and-hold circuit providing dynamic off-set cancellation that is blind to Hall switch current voltage transients and to the characteristic off-set voltages both of the Hall voltage amplifier and the Hall plate without the use of input switching charge-transfer amplifier circuits.

It is a further object of this invention to provide such a Hall sensor in which the Hall voltage is amplified by a gain-chopped differential linear analog amplifier for blanking Hall-switching noise spikes.

It is yet a further object of this invention to provide such a Hall sensor in which the sample-and-hold circuit is a chopped cross-polarity sample-and-hold circuit that is fully differential for rejection of common mode noise signals.

SUMMARY OF THE INVENTION

A chopped Hall sensor includes a Hall-element switching circuit of the kind in which a Hall element has two pairs of diagonally opposed Hall contacts which are alternately connected to a pair of DC supply conductors and to a pair of Hall-switching-circuit output conductors, whereby the two contact pairs alternately serve as the exciting terminals and the Hall-voltage output terminals, and the Hall-element exciting current is alternately switched from flow in one to flow in another direction through the Hall element, preferably in a quadrature direction.

A first clock generator, connected to and controlling the switching of the Hall switching circuit, produces a binary clock signal ck1 having binary phases φ1 and nφ1 resulting respectively in connecting one and the other of the Hall-element contact pairs to the Hall-voltage output terminals.

A companion clock signal generator connected to the first clock signal generator has a second clock output at which there is produced a binary clock signal ck2 having a binary phase φ2 occurring during a middle portion of each φ1 phase of the ck1 signal. Also, the companion clock signal generator has a third clock output at which there is produced a binary clock signal ck3 having a binary phase φ3 occurring during a middle portion of each nφ1 phase of the ck1 signal;

A linear analog double-differential Hall-voltage amplifier has a differential input connected to the pair of Hall switching-circuit output conductors.

A chopped sample-and-hold circuit is comprised of first and second elemental sample-and-hold circuits, each of which has a first and second elemental sample and hold circuit connected respectively to one and another of the differential outputs of the Hall-voltage amplifier. Each of the first and second elemental sample and hold circuits has a sampling-enabling switch means connected respectively to the second and third clock outputs for respectively sampling the elemental sample and hold circuit input signals only during phases $\phi 2$ and $\phi 3$ and holding the sample signals at the respective outputs of the first and second elemental sample and hold circuits during phases $n\phi 2$ and $n\phi 3$ respectively.

Blanking of Hall-switching-noise is accomplished by applying clock signal ck4 (FIG. 4d) to amplifier 30 for momentarily reducing amplifier gain during switching transitions.

A summer circuit is included having a first input connected to the output of the first elemental sample and hold circuit and having a second input connected to the output of the second elemental sample and hold circuit, the output of the summer circuit serving as the output of the Hall sensor.

Thus in the chopped Hall sensor of this invention, the large switching transients, occurring during switch phase transitions in the Hall-element switching circuit, become irrelevant because the amplified Hall-voltage signal is sampled after full settling of the amplifier and the Hall element.

A second embodiment is constructed by adding to the above-described chopped sample-and-hold circuit third and fourth elemental sample-and-hold circuits. Each of the third and fourth elemental sample and hold circuits has an input connected respectively to the another and the one of the differential outputs of the Hall-voltage amplifier. Each of the third and fourth elemental sample and hold circuits also has a sampling-enabling switch means connected respectively to the second and third clock outputs for respectively sampling the elemental sample and hold circuit input signals only during phases $\phi 2$ and $\phi 3$ and holding the sample signals at the respective outputs of the third and fourth elemental sample and hold circuits during phases $n\phi 2$ and $n\phi 3$ respectively. There are also added to the summer circuit a third input connected to the output of the third elemental sample and hold circuit and a fourth input connected to the output of the fourth elemental sample and hold circuit.

(The first, second, third and forth elemental sample and hold circuits correspond to the elemental sample and hold circuits in FIG. 6 producing respectively the output voltages V1, V2, V3 and V4).

This chopped sample-and-holed circuit is a full-differential crossed-polarity sample-and-hold circuit. It provides rejection of undesirable common mode clock induced noise signals, variations in the supply voltage, and signals attributable to charge injection and droop generated in the elemental sample and hold circuits, because these unwanted signals are presented to the summer circuit as common mode signals by the crossed-polarity sample-and-hold circuit.

Further, a Hall-switching-noise blanking feature may advantageously be added to the chopped Hall sensor of either embodiment. To do so the companion clock signal generator is made additionally capable of generating at a fourth clock output a binary clock signal ck4 having a binary phase $\phi 4$ that is synchronized to occur for a time span encompassing each occurrence of a transition between phases $\phi 1$ and $n\phi 1$ in the clock signal ck1.

The double-differential Hall-voltage amplifier additionally includes an electrically actuated gain-reduction switch means connected to the fourth clock output for during each phase $\phi 4$ in clock signal ck4 reducing the differential gain of the Hall-voltage amplifier. This amplifier blanking feature further improves the ratio of the Hall-sensor output signal to Hall switching noise spikes.

BRIEF DESCRIPTION OF THE DRAWINGS

FIG. 1 shows a Hall plate in a switching circuit of the prior art for alternately switching the Hall current direction.

FIGS. 2a, 2b, 2c and 2d show respectively the voltage waveforms in the Hall switching circuit of FIG. 1 of the clock signal (ck1) to the Hall switches, the Hall off-set output-voltage component (Vos), the Hall magnetic-field-induced output voltage component ($V_H$), and the Hall switching-circuit output voltage ($V_{sH}$).

FIG. 3 shows a simplified block diagram of a Hall sensor with chopped cross-polarity sample-and-hold construction of this invention including a simplified Hall switching circuit which is equivalent to that of FIG. 1, followed by a Hall voltage amplifier, and a chopped cross-polarity sample-and-hold circuit.

FIGS. 4a, 4b, 4c and 4d show respectively the voltage waveforms of the clocking signals ck1, ck2, ck3 and ck4 in the simplified Hall sensor of FIG. 3, all drawn to the same time scale.

FIGS. 5a and 5b show the voltage waveforms in the simplified Hall sensor of FIG. 3 respectively of the voltage Va+ at one differential output of the Hall-voltage amplifier and the voltage Va− at the other differential output of the Hall-voltage amplifier.

DESCRIPTION OF THE PREFERRED EMBODIMENTS

Figure 6:
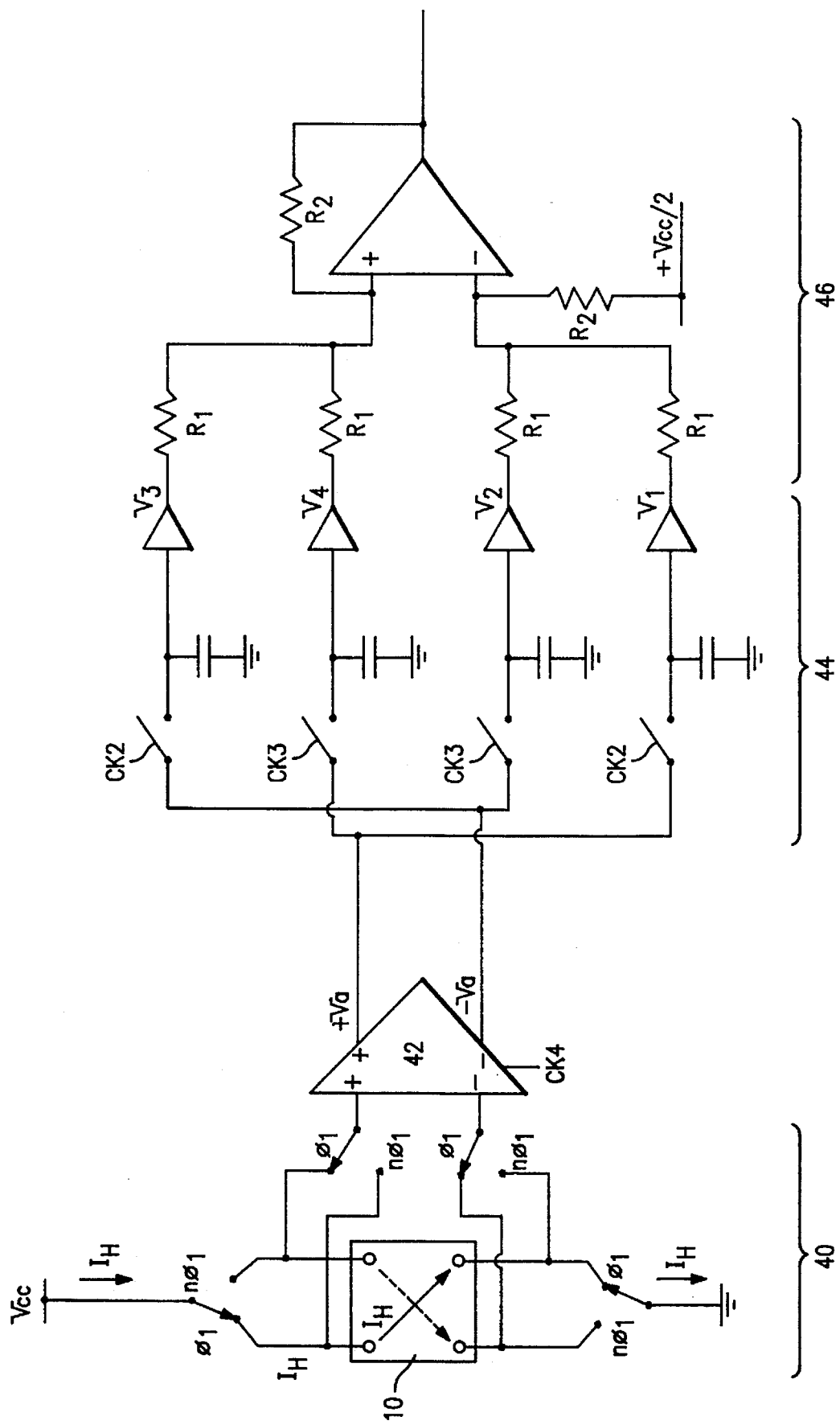
FIG. 6 shows a block diagram of a fully differential Hall sensor with chopped-cross-polarity sample-and-hold circuit of this invention including a Hall switching circuit as in FIG. 1 followed by an analog Hall voltage amplifier, a fully differential sample and hold circuit and a signal summer circuit.

In the Hall sensor of FIG. 3, an equivalent circuit 20 to a switching Hall circuit such as that of FIG. 1 includes the signal generating blocks 22 and 24 which respectively generate the signals $+V_H$ during $\phi 1$ and $n\phi 1$, the block 26 which generates the off-set signal Vos and the single pole single throw switch 28 which is controlled by the binary clock signal ck1 as seen in FIG. 4a. The equivalent circuit is useful for a clearer understanding of circuits of this invention.

The Hall-voltage amplifier 30 is meant to be an ideal double differential linear analog amplifier and its input-referred off-set voltage Voa is generated by block 32 which is in series with one amplifier input and the output of the switching Hall circuit 20. Significantly, the off-set voltage Vos of the switching Hall circuit 20 and the off-set voltage Voa of the amplifier 30 are two DC voltages that are generated in series and taken together amount to a summed DC off-set voltage Vosa. The signal at the input of the ideal amplifier 30 may therefore said to be $V_{sH}=V_H+$Vosa during phase $\phi 1$ (of clock signal ck1) and $V_{sH}=-V_H+$Vosa during phase n$\phi$1 (of the other and complimentary phase to $\phi$1 in clock signal ck1). Thus the amplifier output signals are $+Va=(G/2)(V_H+Vosa)$ and $-Va=-(G/2)(-V_H+Vosa)=(G/2)(V_H-Vosa)$ where G is the differential-to-differential gain of the amplifier 30.

The output signals +Va and −Va of the amplifier 30 are respectively applied to the inputs of the chopped cross-polarity sample-and-hold circuits 34 and 36. Circuits 34 and 36 are activated to sample the input signals +Va and −Va by clock signals ck2 and ck3.

Waveforms of the clock signals ck2 and ck3 in FIGS. 4b and 4c, respectively, are seen to activate the sampling of sample-and-hold circuits 36 and 34 for a duration less than the full span of phase $\phi$1 and n$\phi$1 respectively.

Furthermore the sample times established by both clock signals ck2 and ck3 are non-coincident with the phase transitions in ck1, i.e. transitions from $\phi$1 to n$\phi$1 and vice versa. Sampling is therefore caused to occur only during a time between phase transitions in clock signal ck1 and at a time after each such phase transition when the amplifier 30 and the Hall element 10 have settled after occurrence of the voltage spikes generated at each Hall switching transition.

In FIG. 5a, the output $V_{34}$ of the sample-and-hold circuit 34 is superimposed on the amplifier output signal +Va. At each high pulse in the clock signal ck2, the sample-and-hold circuit 34 is enabled (i.e. activated) to sample the amplifier output signal +Va. During the time between high pulses in signal ck2, the sampled signal $V_{34}$ will decay slightly while "holding". Except for this decay, or droop, the average value of $V_{34}$ equals that of the positive portion of signal +Va.

The output $V_{36}$ of the sample-and-hold circuit 36 is superimposed (as a heavier line) on the amplifier output signal −Va in FIG. 5b. At each high pulse in the clock signal ck3, the sample-and-hold circuit 36 is enabled (i.e. activated) to sample the amplifier output signal −Va. Except for this decay the average value of $V_{36}$ equals that of the positive portion of signal −Va.

It is therefore seen that during a late central portion of each phase $\phi$1 period of the Hall clock ck1, a high pulse in clock signal ck2 occurs during phase $\phi$2 for activating the sample-and-hold circuit 34, and likewise during a late central portion of each phase n$\phi$1 period of the Hall clock ck1, a high pulse in clock signal ck3 occurs during phase $\phi$3 for activating the sample-and-hold circuit 36.

Thus the two signal voltages $V_{34}$ and $V_{36}$ are proportional to the positive and negative peak voltages respectively in the switched-Hall-circuit output signal $V_{sH}$ without being corrupted by voltage spikes in that signal and by distortions in the amplifier output signals during amplifier recovery from those Hall-switching voltage spikes.

The two sample-and-hold output signals $V_{34}$ and $V_{36}$ are passed to a voltage summer 38 which produces a summer output voltage of $V_S = V_{34} + V_{36}$
$= (G/2)(V_H+Vosa)+(G/2)(V_H-Vosa)=GV_H.$ Alternatively, the summer circuit 38 may be of the kind (having a gain of 0.5) that averages the two input signals $V_{34}$ and $V_{36}$ in which case the summer output voltage signal will be simply $(G/2)V_H$.

The fully differential Hall sensor of FIG. 6 has a switched Hall circuit 40, a Hall voltage amplifier 42, a clocked-cross-polarity differential sample-and-hold circuit 44 and a summer circuit 46. These major components of the Hall sensor of FIG. 6 perform the same functions as do the corresponding major components in FIG. 3. These Hall sensors provide a great reduction in the Hall off-set and amplifier off-set voltages in the summer output voltage, namely the sensor output voltage. The Hall sensor of FIG. 6 exhibits even less ripple, than the circuit of FIG. 3, which reduced ripple is attributable to the cancellation of the differential droop and the charge injection effects of the sample and hold circuits, and a reduction in other common-mode noises such as supply voltage variations.

The amplifier 42 (FIG. 6) has an additional feature, namely a noise blanking feature whereby the fore-mentioned noise spikes generated at the phase transitions in the Hall switching clock ck1 are attenuated in the Hall voltage amplifier 42. This is accomplished by a common-blanking switch internal to the amplifier 42, which substantially reduces the amplifier gain during the phase transitions in clock ck1. Blanking is effected by a clock signal ck4 having a waveform as shown in FIG. 4d that is synchronized with the Hall switching clock signal ck1 of FIG. 4a.

Figure 7:
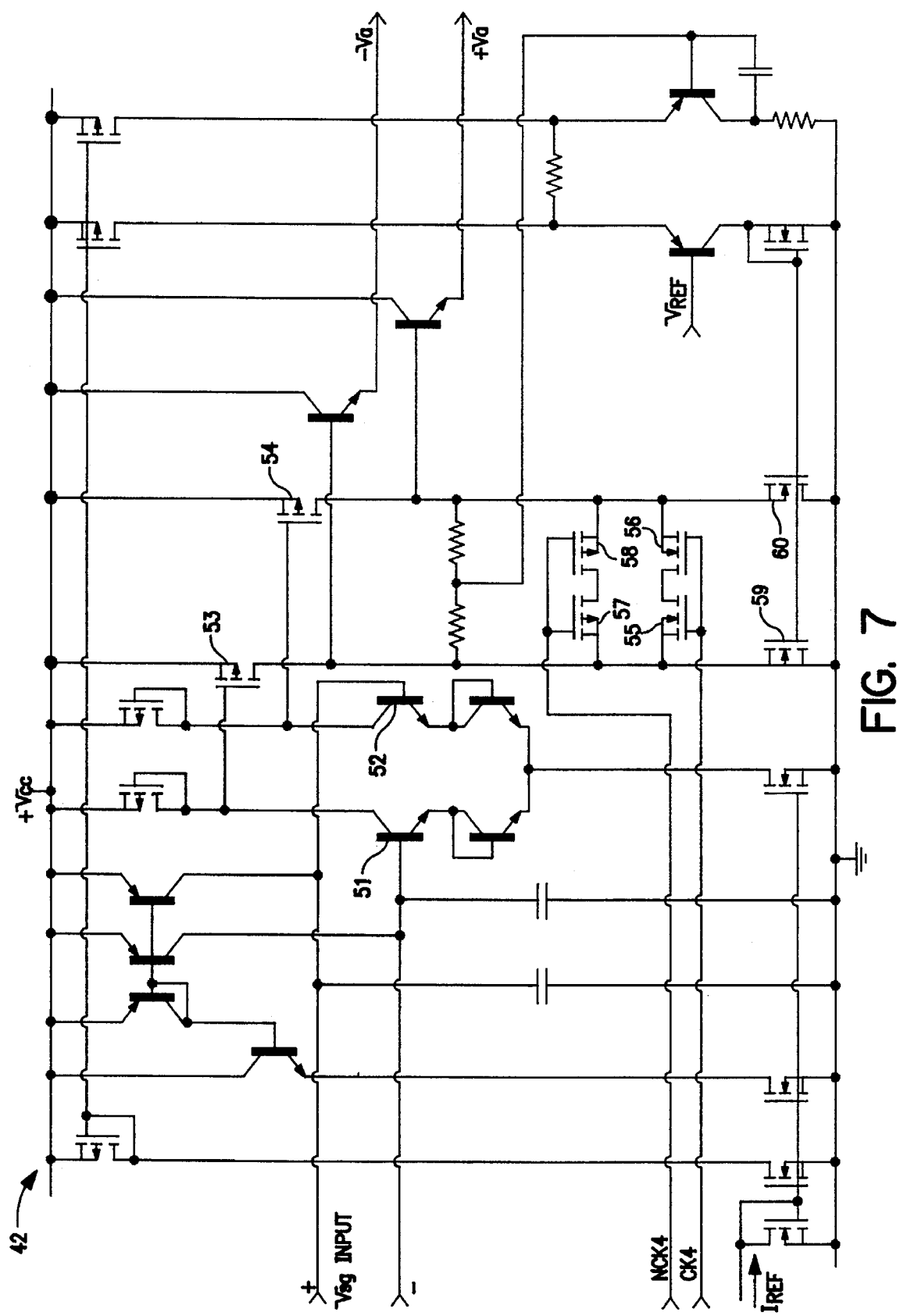
FIG. 7 shows a circuit diagram of a Hall-voltage amplifier of this invention.

Referring to FIG. 7, the double differential amplifier 42 is formed in an integrated circuit and employs bipolar amplifying transistors 51 and 52 followed by two P-MOS current mirror transistors 53 and 54, and current source transistors 59 and 60. The differential output of these two mirrors is periodically shunted by the switch composed of the four MOS transistors 55, 56, 57 and 58. When the N-MOS and P-MOS transistors are turned on by clock signal ck4 during phases $\phi$4 and n$\phi$4, respectively, the amplifier is quasi shorted, substantially reducing the amplifier gain while carrying out the function of blanking noise spikes generated at ck1 phase transitions. This amplifier blanking feature further improves the ratio of the Hall-sensor output signal to Hall switching noise.

Figure 8:
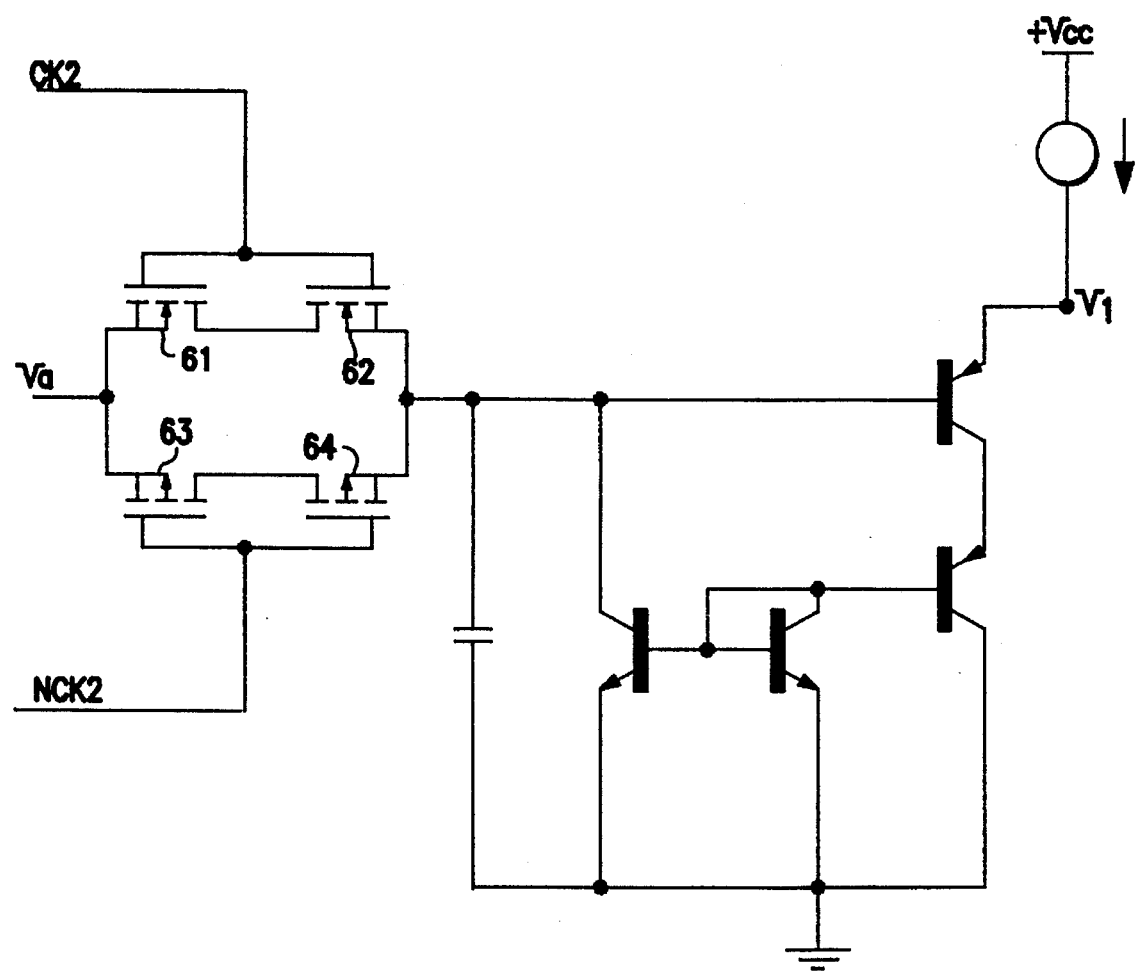
FIG. 8 shows a circuit diagram of a sample-and-hold circuit element suitable for use in the chopped cross-polarity sample-and-hold circuits of this invention.

The Hall sensor circuit of FIG. 6, including the amplifier of FIG. 7 and including four elemental sample-and-hold circuits shown in FIG. 8 (substituting for the multiple sample-and-hold circuit 44 of FIG. 6), is capable of operation at a clock (ck1) frequency greater than 200 kHz and thus the remaining ripple attributable to the typical stair-case waveforms after sampling and to eventual clock feedthrough can be filtered using a low pass filter with a relatively small integratable filter capacitor. The sample-and-hold switch in FIG. 8 is composed of four MOS transistors 61, 62, 63 and 64 and a buffer circuit. The four MOS transistors are clocked by a pair of complementary clock signals ck2 and nck2 (or ck3 and nck3), in the same manner as is the noise-blanking switch using transistors 55–58 in the amplifier 42 of FIG. 7.

The differential-to-differential amplifier, e.g. amplifier 42, may be replaced by a differential-input single-ended output type amplifier with the amplifier output connected directly to one (or pair of) sample and hold circuit(s) and connected Via an invertor to the other (or pair of) sample and hold circuit(s), providing essentially the same results as for the Hall sensor of FIG. 3 (or of FIG. 6).

We claim:

1. A chopped Hall sensor of the kind including a Hall element having two pairs of diagonally opposed Hall contacts, said contacts being spaced-apart and located near the periphery of said Hall element, a pair of DC supply conductors to which a DC source for exciting said Hall-element may be connected, one clock signal generator for generating at a first clock output a binary clock signal ck1 having binary phases $\phi$1 and n$\phi$1, and a Hall-element switching-circuit means connected to said first clock output and having a pair of Hall switching-circuit output conductors for during phase φ1 connecting one of said diagonally-opposed contact pairs to said pair of DC supply conductors while simultaneously connecting the other of said diagonally opposed contact pairs to said pair of Hall switching-circuit output conductors, and for during phase nφ1 connecting said other of said diagonally-opposed contact pairs to said pair of DC supply conductors While simultaneously connecting said one pair of diagonally opposed Hall contacts to said pair of Hall switching-circuit output conductors, wherein the improvement comprises:

a) a companion clock signal generator connected to said one clock signal generator having a second clock output for generating at said second clock output a binary clock signal ck2 having a binary phase φ2 occurring during a middle portion of each φ1 phase of said ck1 signal, and having a third clock output for generating a binary clock at said third clock output a signal ck3 having a binary phase φ3 occurring during a middle portion of each nφ1 phase of said ck1 signal;

b) a linear analog double-differential Hall-voltage amplifier having a differential input connected to said pair of Hall switching-circuit output conductors;

c) a chopped sample-and-hold circuit comprised of first and second elemental sample-and-hold circuits, each of said first and second elemental sample and hold circuits having an input connected respectively to the one and another polarities of the differential output of said Hall-voltage amplifier, each of said first and second elemental sample and hold circuits having a sampling-enabling switch means connected respectively to said second and third clock outputs for respectively sampling the elemental sample and hold circuit input signals only during phases φ2 and φ3 and holding the sample signals at the respective outputs of said first and second elemental sample and hold circuits during phases nφ2 and nφ3 respectively; and d) a summer circuit having a first input connected to the output of said first elemental sample and hold circuit and having a second input connected to the output of said second elemental sample and hold circuit, the output of said summer circuit serving as the output of said Hall sensor.

2. The chopped Hall sensor of claim 1 wherein said companion clock signal generator is additionally for generating at a fourth clock output a binary clock signal ck4 having a binary phase φ4 that is synchronized to occur for a time span encompassing each occurrence of a transition between phases φ1 and nφ1 in the clock signal ck1, said double-differential Hall-voltage amplifier including an electrically actuated gain-reduction switch means connected to said fourth clock output for during each phase φ4 in clock signal ck4 reducing the differential gain of said Hall-voltage amplifier.

3. The chopped Hall sensor of claim 1 wherein said chopped sample-and-hold circuit is additionally comprised of third and fourth elemental sample-and-hold circuits, each of said third and fourth elemental sample and hold circuits having an input connected respectively to said another and said one of the differential outputs of said Hall-voltage amplifier, each of said third and fourth elemental sample and hold circuits having a sampling-enabling switch means connected respectively to said second and third clock outputs for respectively sampling the elemental sample and hold circuit input signals only during phases φ2 and φ3 and holding the sample signals at the respective outputs of said third and fourth elemental sample and hold circuits during phases nφ2 and nφ3 respectively, said summer circuit additionally having a third input connected to said output of said third elemental sample and hold circuit and having a fourth input connected to said output of said fourth elemental sample and hold circuit, so that said chopped sample-and-hold circuit is a full-differential crossed-polarity sample-and-hold circuit.

* * * * *